(12) United States Patent
Yamamoto

(10) Patent No.: US 6,444,571 B1
(45) Date of Patent: Sep. 3, 2002

(54) PROCESS FOR FABRICATING A SEMICONDUCTOR DEVICE WITH IMPROVED STEP COVERAGE AND RELIABILITY OF A LOWER ALUMINUM LINE

(75) Inventor: Yoshiaki Yamamoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/449,236

(22) Filed: Nov. 24, 1999

(30) Foreign Application Priority Data

Nov. 27, 1998 (JP) .......................... 10-337804

(51) Int. Cl.[7] .......................... H01L 21/4763
(52) U.S. Cl. .................. 438/637; 438/622; 438/624; 438/626; 438/628
(58) Field of Search ................. 438/622, 624, 438/626, 628, 637, 638

(56) References Cited

U.S. PATENT DOCUMENTS 5,364,818 A * 11/1994 Ouettet .................... 438/476
5,447,613 A * 9/1995 Ouettet .................... 204/192.1
5,643,407 A * 7/1997 Chang ...................... 438/623

FOREIGN PATENT DOCUMENTS

| JP | 64-76736 | 3/1989 |
| JP | 5-47759 | 2/1993 |
| JP | 5-55225 | 3/1993 |
| JP | 9-64037 | 3/1997 |
| JP | 10-233444 | 9/1998 |

* cited by examiner

*Primary Examiner*—Michael J. Sherry
*Assistant Examiner*—Asok Kumar Sarkar
(74) *Attorney, Agent, or Firm*—Hutchins, Wheeler & Dittmar

(57) ABSTRACT

A lower aluminum line is exposed to a via-hole formed in an inter-level insulating layer, and an outgassing is carried out before deposition for an upper aluminum line connected through the via-hole to the lower aluminum line, wherein the outgassing is carried out at a substrate temperature equal to or less than the maximum substrate temperature in the formation of the inter-level insulating layer so that a hillock and a whisker due to the thermal stress do not take place in the lower aluminum line.

14 Claims, 8 Drawing Sheets

PROCESS FOR FABRICATING A SEMICONDUCTOR DEVICE WITH IMPROVED STEP COVERAGE AND RELIABILITY OF A LOWER ALUMINUM LINE

FIELD OF THE INVENTION

This invention relates to a fabrication technology for a semiconductor device and, more particularly, to a process for fabricating a semiconductor device having via holes.

DESCRIPTION OF THE RELATED ART

A large number of circuit components are fabricated on a single semiconductor chip, to form an integrated circuit device. The integrated circuit has become more complicated, and, accordingly, the circuit components have been increased. However, it is not desirable to enlarge the size of the semiconductor chip. For this reason, the manufacturer miniaturizes the circuit components of the integrated circuit. A multi-layered wiring structure is required for the integrated circuit, and the conductive lines on different levels are connected through via-holes. The via-holes have been also miniaturized. A multi-layered wiring structure for an ultra large scale integration includes via-holes, the aspect ratio of which may be equal to or greater than 1.

Conductive lines on an upper-level are usually formed of aluminum or aluminum alloy. The aluminum/aluminum alloy is deposited by using a sputtering process, and the aluminum/aluminum alloy layer is patterned into conductive lines through a photo-lithography and an etching step. While the aluminum/aluminum alloy target is being sputtered, the aluminum/aluminum alloy fills the via-holes, and swells into the aluminum/aluminum alloy layer over the inter-level insulating layer However, the aluminum/aluminum alloy hardly forms a smooth upper surface around the via-holes with the aspect ratio of not less than 1, and thus the step-coverage is poor. The poor step-coverage results in a low reliability of the upper-level conductive lines.

A multiple-step high-temperature sputtering technology is proposed for improving the step coverage in Japanese Patent Publication of Unexamined Application No. 64-76736. FIGS. 1A to 1H illustrate the prior art multiple-step high-temperature sputtering technology disclosed in the Japanese Patent Publication of Unexamined Application.

Circuit components are fabricated on a silicon substrate (not shown), and are covered with a first inter-level insulating layer 1. A lower metal line 2 of aluminum is patterned on a the lower inter-level insulating layer 1 as shown in FIG. 1A. Insulating material is deposited over the entire surface of the resultant structure by using a plasma-assisted chemical vapor deposition at 380 degrees Centigrade, and forms a second inter-level insulating layer 3 as shown in FIG. 1B.

A photo-resist etching mask (not shown) is formed on the second inter-level insulating layer 3, and has an opening over the lower metal line 2. Using the photo-resist etching mask exposes a part of the second inter-level insulating layer 3 to an etchant, and the second inter-level insulating layer 3 is selectively etched away so as to form a via-hole 4 in the second inter-level insulating layer 3 as shown in FIG. 1C.

Subsequently, an outgassing is carried out in high-temperature vacuum. The resultant structure is placed in vacuum, and is heated to 450 degrees Centigrade. The high-temperature vacuum ambient for the outgassing is higher in temperature than a sputtering temperature described hereinlater with reference to FIG. 1G. Then, the second inter-level insulating layer 3 emits gas as indicated by arrows in FIG. 1D.

In order to enhance the surface property known as wettability, titanium is deposited over the entire surface, and forms a titanium layer 5. The resultant structure is maintained in the vacuum chamber without breaking the vacuum, and aluminum is deposited over the entire surface in low-temperature ambient at a high sputtering rate. Thus, an aluminum layer 6 is deposited on the titanium layer 5 as shown in FIG. 1F. The aluminum layer 6 defines a secondary via-hole 7.

Subsequently, aluminum is deposited over the entire surface of the resultant structure in a high-temperature ambience at a low sputtering rate without breaking the vacuum. The high-temperature low-rate sputtering results in a surface diffusion of aluminum. The aluminum fills the secondary via-hole 7, and swells into an aluminum layer 8 The aluminum layer 8 is merged into the aluminum layer 6, and the titanium reacts with the aluminum to form a titanium-aluminum alloy layer 9 as shown in FIG. 1G.

The titanium-aluminum layer 9 and the aluminum layer 8 are patterned into an upper metal line 10 by using a photo-lithography and etching process. The resultant wiring structure is shown in FIG. 1H.

The high-temperature low-rate sputtering gives rise to the surface diffusion, and fills the miniature via-hole 7 with the aluminum. As a result, the step-coverage is substantially improved. However, a problem is encountered in the prior art process in that hillocks and whiskers are grown from the lower metal line 2 due to the thermal stress. The hillocks and the whiskers may cause a short-circuit between the aluminum lines.

SUMMARY OF THE INVENTION

It is therefore an important object of the present invention to provide a process for fabricating a semiconductor device which has improved step coverage without any short-circuit.

The present inventor contemplated the problem. Although the lower metal line 2 of refractory metal such as tungsten or titanium nitride was free from the problem, the refractory metal and the refractory metal nitride have larger resistivity values than aluminum, and were not desirable for a high-speed integrated circuit. Then, the present inventor investigated the prior art process, and paid attention to the outgassing step. The present inventor carried out the outgassing at different temperatures in the prior art process, and obtained plural groups of samples different in outgassing temperature. The present inventor observed the plural groups of samples to see how may lower metal lines 2 were damaged by hillocks and whiskers. The present inventor plotted the number of damaged samples in terms of the heating temperature as shown in FIG. 2. The present inventor noticed that the number of damaged samples drastically increased from where the outgassing temperature was roughly equal to the deposition temperature of the second inter-level insulating layer 3. The present inventor concluded that the critical outgassing temperature was roughly equal to the deposition temperature of the second inter-level insulating layer 3.

To accomplish the object, the present invention proposed to carry out an outgassing process at a temperature that is not higher than a deposition temperature of the inter-level insulating layer.

In accordance with one aspect of the present invention, there is provided a process for fabricating a semiconductor device comprising the steps of a) forming a lower metal line over a semiconductor substrate, b) covering the lower metal line with an inter-level insulating layer under the condition that the semiconductor substrate is heated to a first temperature at the maximum, c) forming a via-hole in the inter-level insulating layer, d) carrying out an outgassing under the condition that the semiconductor substrate is heated to a second temperature equal to or less than the first temperature so as to remove contaminants from the inter-level insulating layer and e) forming an upper metal line penetrating into the via-hole and formed of a conductive material selected from the group consisting of aluminum and aluminum alloys.

BRIEF DESCRIPTION OF THE DRAWINGS

The features and advantages of the process will be more clearly understood from the following description taken in conjunction with the accompanying drawings in which.

DESCRIPTION OF THE PREFERRED EMBODIMENTS

First Embodiment

FIGS. 3A to 3H illustrate a process for fabricating a semiconductor device embodying the present invention. The process starts with preparation of a semiconductor substrate 20. Though not shown in FIGS. 3A to 3H, circuit components such as field effect transistors of an integrated circuit are fabricated on the semiconductor substrate 20.

Figure 1A:
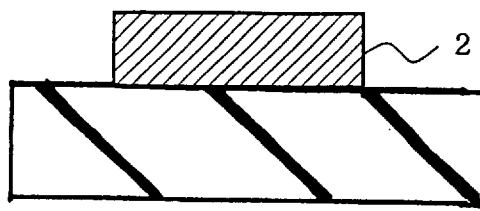
FIGS. 1A to 1H are cross sectional views showing the prior art process disclosed in Japanese Patent Publication of Unexamined Application No. 64-76736.
Figure 1B:
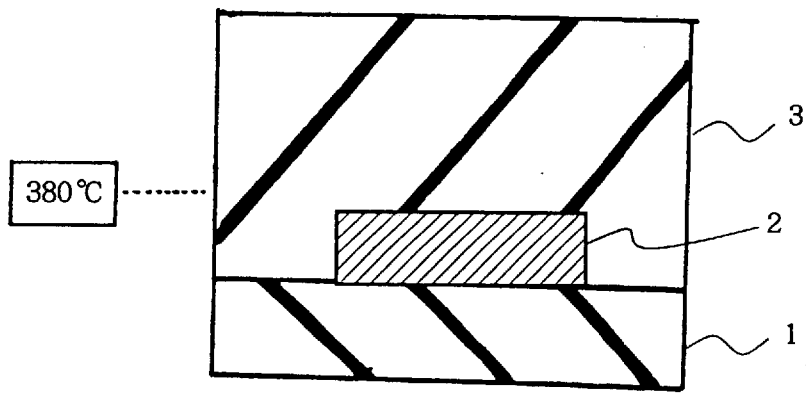
Figure 1C:
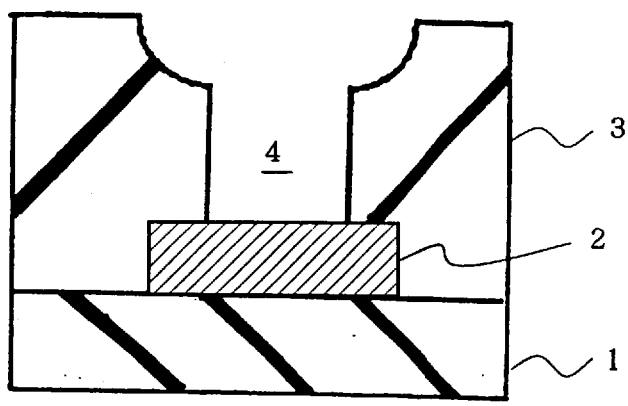
Figure 1D:
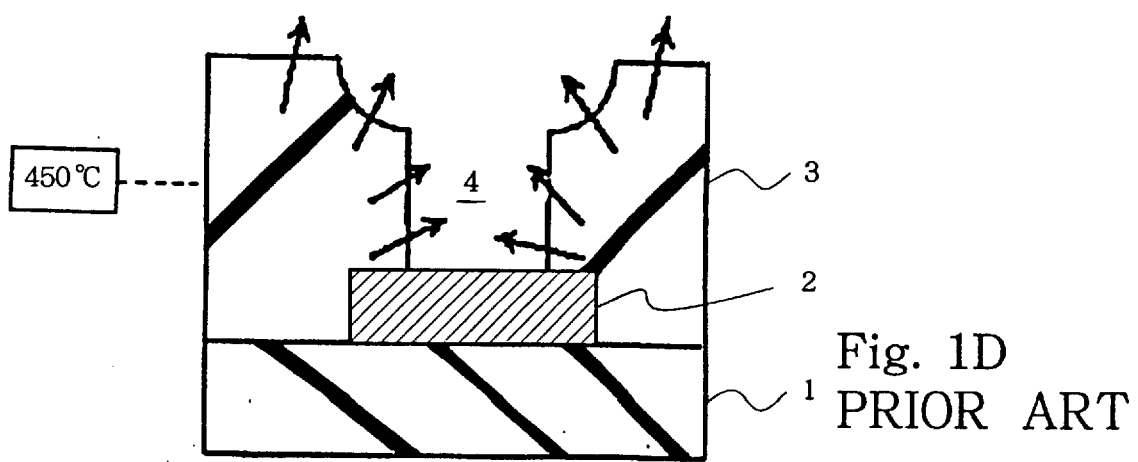
Figure 1E:
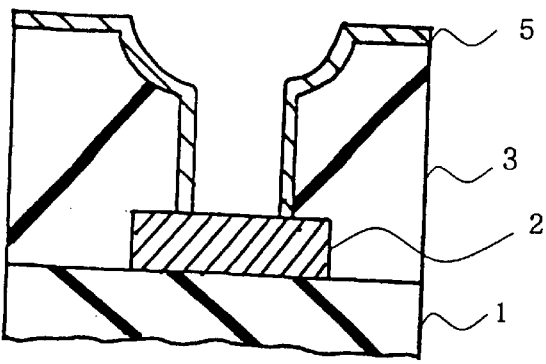
Figure 1F:
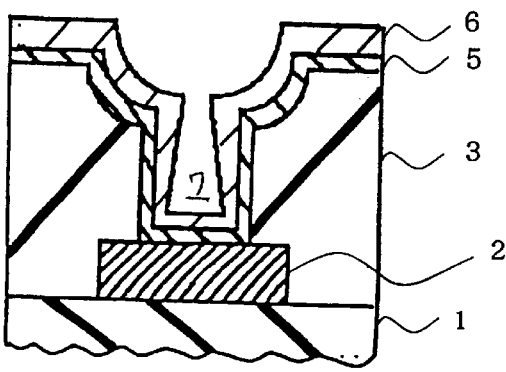
Figure 1G:
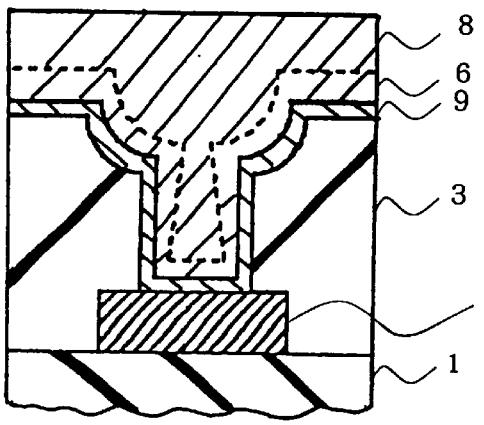
Figure 1H:
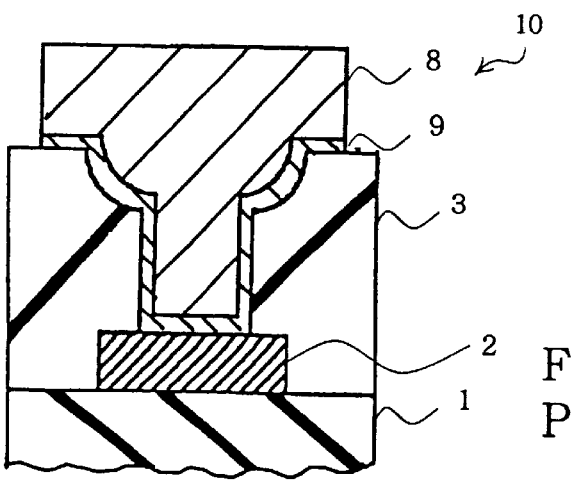
Figure 2:
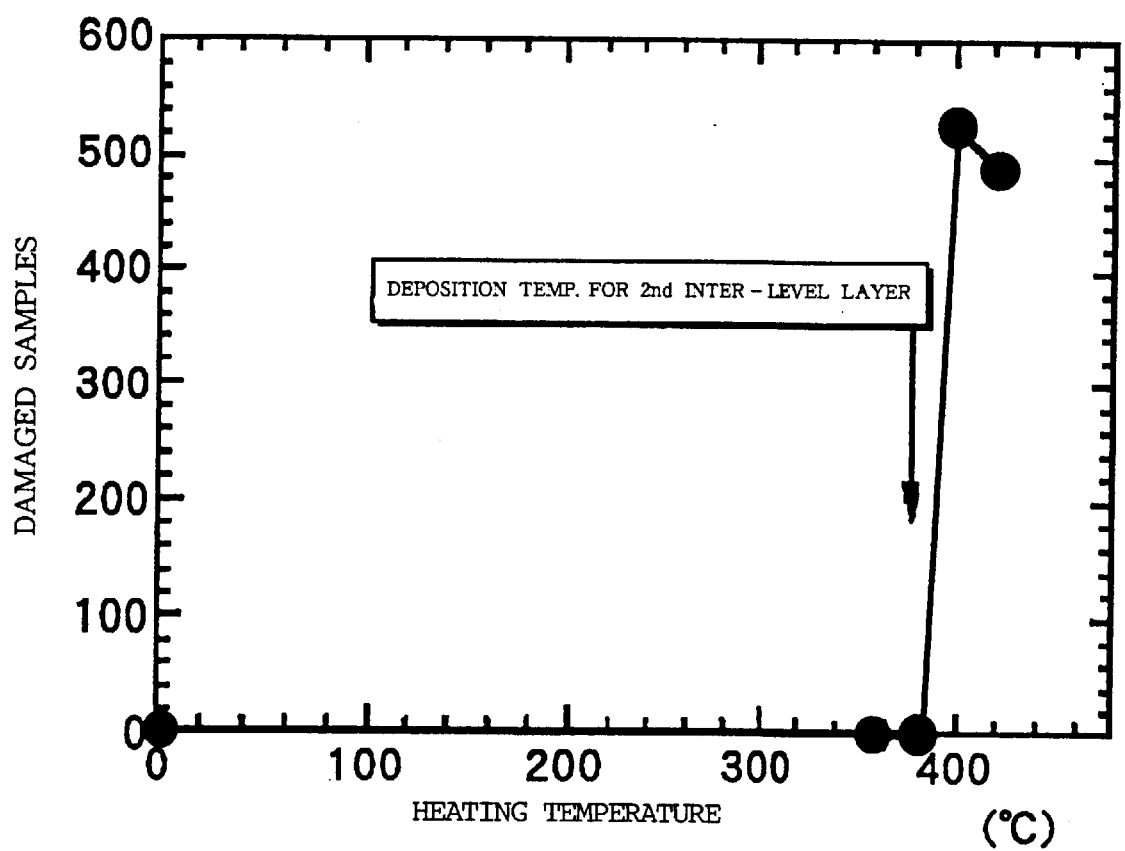
FIG. 2 is a graph showing the relation between the damaged samples and the heating temperature.
Figure 3A:
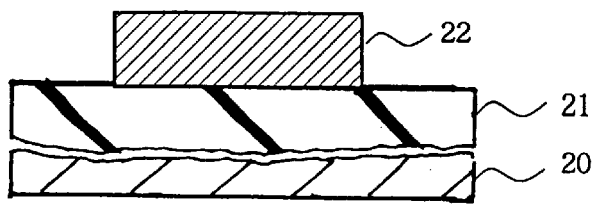
FIGS. 3A to 3H are cross sectional views showing essential steps of a process for fabricating a semiconductor device according to the present invention.
Figure 3B:
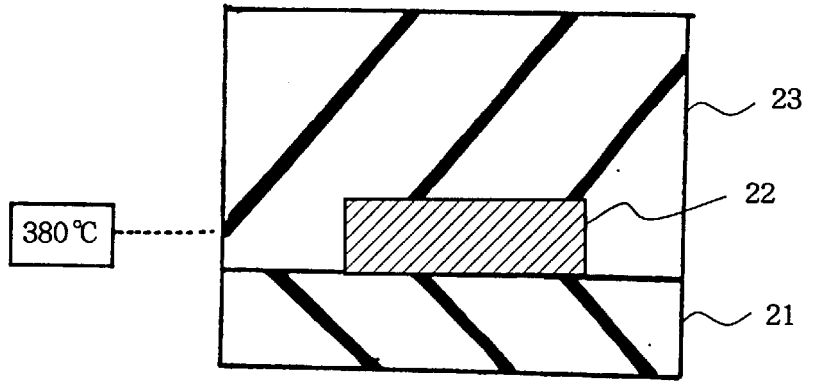

Insulating material is deposited over the semiconductor substrate 20, and the circuit components are covered with a first inter-level insulating layer 21. Aluminum or aluminum alloy is deposited over the entire surface of the first inter-level insulating layer 21 by using a sputtering process. The aluminum alloy is, by way of example, aluminum-copper alloy or aluminum-silicon-copper alloy. Photo-resist solution is spread over the entire surface of the aluminum/ aluminum alloy layer, and is baked so as to form a photo-resist layer. A pattern image for lower-metal lines is transferred to the photo-resist layer, and a latent image is produced in the photo-resist layer. The latent image is developed, and the photo-resist layer is shaped into a photo-resist etching mask (not shown). Using the photo-resist etching mask, the aluminum/aluminum alloy layer is selectively etched, and a lower-metal line 22 is left on the first inter-level insulating layer 21 as shown in FIG. 3A. Thus, the lower-metal line 22 is formed through a photo-lithography and etching process.

Subsequently, insulating material such as silicon oxide is deposited over the entire surface of the resultant structure by using a plasma-assisted chemical vapor deposition, and forms a second inter-level insulating layer 23. While the insulating material is being grown, the semiconductor substrate 20 is heated to a certain temperature TW. In this instance, the certain temperature TW is 380 degrees Centigrade. The certain temperature TW ranges from 200 degrees to 600 degrees Centigrade. However, the certain temperature TW is preferably within the range between 400 degrees and 200 degrees Centigrade. After the deposition of the insulating material, the second inter-level insulating layer 23 may be chemically mechanically polished so as to create a smooth top surface.

Figure 3C:
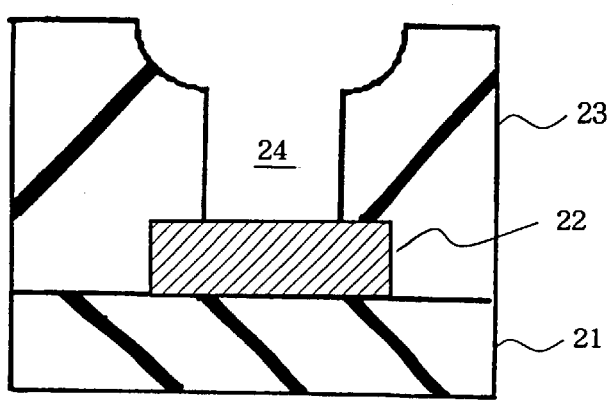
Figure 3D:
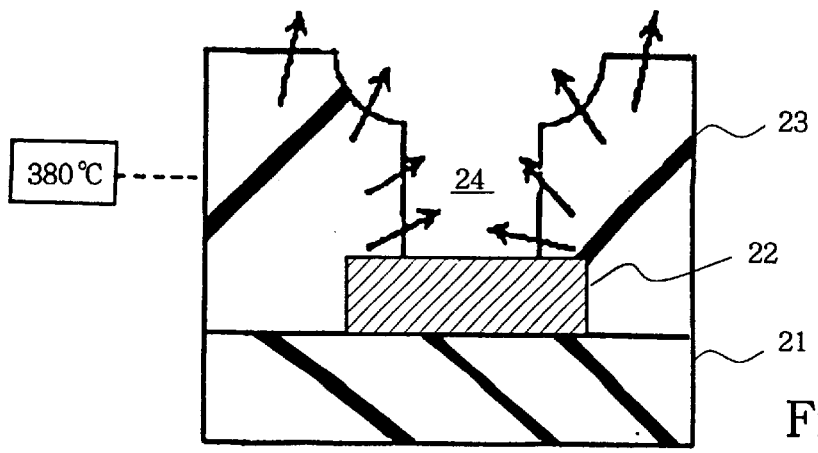

Subsequently, a photo-resist etching mask (not shown) is patterned on the second inter-level insulating film 23 through photo-lithography The photo-resist etching mask exposes a part of the second inter-level insulating layer 23 over the lower metal line 22 to dry etchant and, thereafter, to wet etchant, and the dry etchant and the wet etchant form a via-hole 24 in the second inter-level insulating layer 23. The dry etchant anisotropically etches the part of the second inter-level insulating layer 23, and causes the via-hole 24 to have an aspect ratio not less than 1. On the other hand, the wet etchant isotropically etches an upper portion of the second inter-level insulating layer 23 around the via-hole 24, and rounds the periphery of the second inter-level insulating layer 23. Upon completion of the two kinds of etching, the via-hole 24 is shaped into a funnel configuration as shown in FIG. 3C. The via-hole may alternatively be formed using dry etchant only.

Subsequently, aluminum is deposited by using a two-step sputtering as follows. The two-step sputtering has an outgassing step (see FIG. 3D), a cooling step, an improvement of wettability (see FIG. 3E), a low-temperature high-rate sputtering (see FIG. 3F) and a high-temperature low-rate sputtering (see FIG. 3G), and these steps are successively carried out in a sputtering chamber without breaking vacuum.

In detail, the semiconductor substrate 20 is heated to 380 degrees Centigrade for the outgassing. Water $H_2O$, the water component OH and other contaminants are vaporized, and are removed from the entire surface of the resultant structure as indicated by arrows in FIG. 3D. The substrate temperature in the outgassing is at least 200 degrees Centigrade. It is appropriate to carry out the outgassing at the substrate temperature lower that the certain temperature TW by zero to 400 degrees Centigrade. Thus, the substrate temperature in the outgassing step is equal to or lower than the substrate temperature TW in the deposition of the second inter-level insulating layer 23.

Figure 3E:
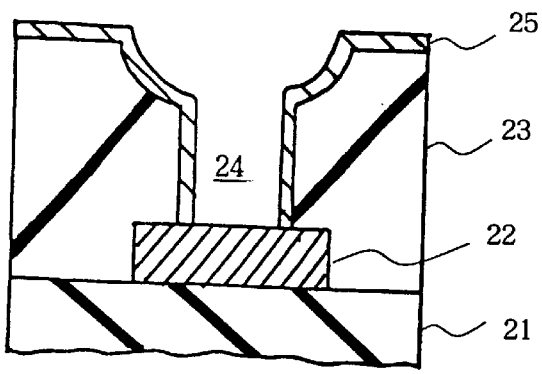

Upon completion of the outgassing, the semiconductor substrate 20 is cooled, and titanium is deposited over the entire surface of the resultant structure without any pre-heating. The titanium forms a titanium layer 25, and the titanium layer 25 conformably extends on the exposed surface of the second inter-level insulating layer 23 as shown in FIG. 3E. The titanium layer 25 improves the wettability for aluminum.

Figure 3F:
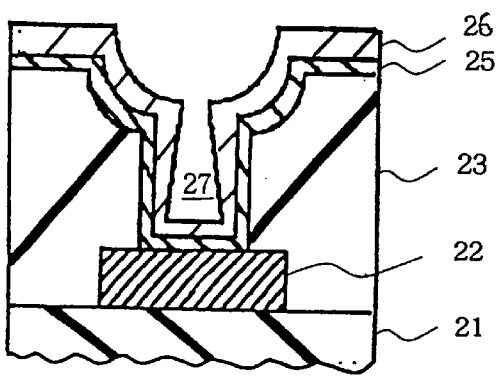
Figure 3G:
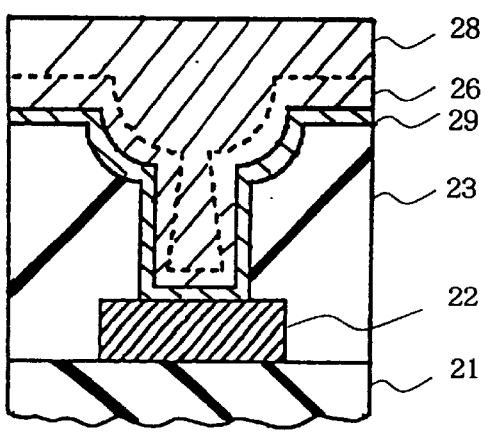

Subsequently, the low-temperature high-rate sputtering is carried out. The semiconductor substrate 20 is not pre-heated or heated to a lower temperature not higher than 150 degrees Centigrade. Aluminum or aluminum alloy is deposited over the entire surface of the titanium layer 25, and forms an aluminum/aluminum alloy layer 26. The aluminum alloy may be aluminum-copper alloy or aluminum-silicon-copper alloy. The low-temperature high-rate sputtering is completed before the aluminum/aluminum alloy closes the via-hole as shown in FIG. 3F. For this reason, the aluminum/ aluminum alloy layer 26 defines a hollow space 27 in the via-hole 24.

The low-temperature high-rate aluminum sputtering is followed by the high-temperature low-rate aluminum sputtering. The semiconductor substrate 20 is heated to 400 degrees to 500 degrees Centigrade, and the aluminum or the aluminum alloy is deposited over the resultant structure at 2000 Å/min, or less. The aluminum/aluminum alloy fills the hollow space 27, and swells into an aluminum/aluminum alloy layer 28. The high temperature promotes the surface diffusion, and the surface diffusion improves the step coverage. While the aluminum/aluminum alloy is being grown at the high temperature, the aluminum reacts with the titanium, and the titanium layer 25 is converted to an aluminum-titanium alloy layer 29.

Figure 3H:
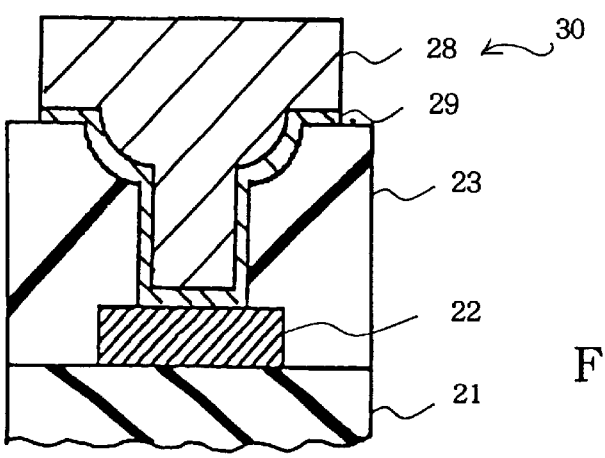

A photo-resist etching mask (not shown) is patterned on the aluminum/aluminum alloy layer 28 through the photo-lithography, and the aluminum/aluminum alloy layer 28 is selectively removed by using dry etchant. Thus, the aluminum-titanium layer 29 and the aluminum/aluminum alloy layer 28 are patterned into an upper metal line 30 as shown in FIG. 3H.

Figure 4:
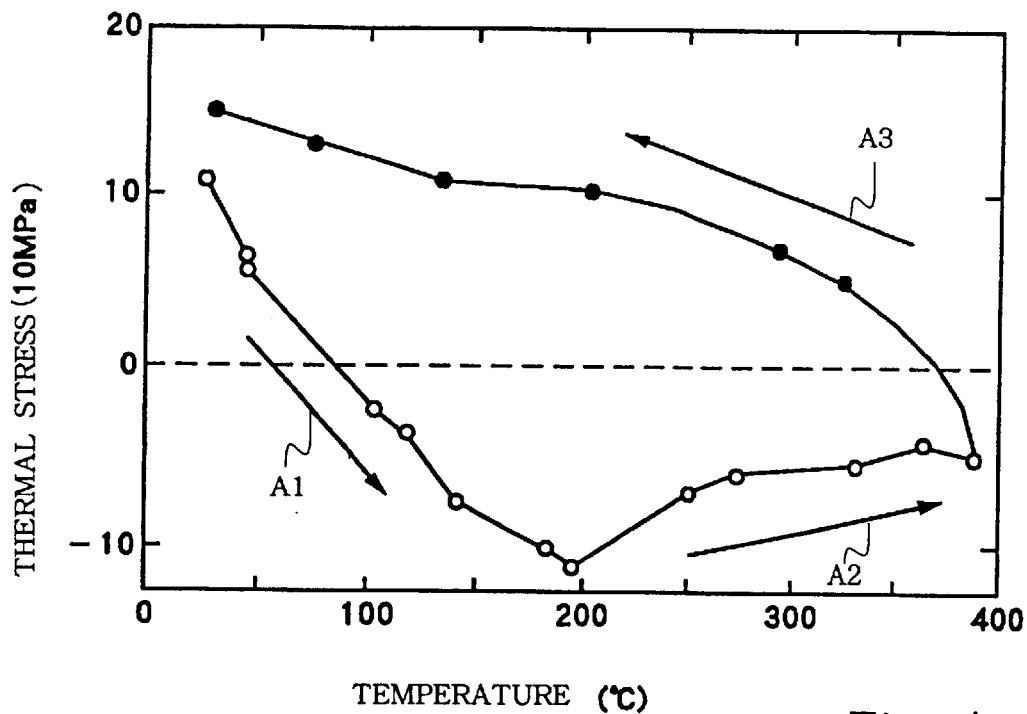
FIG. 4 is a graph showing a relation between a thermal stress exerted on a lower metal line and temperature.

The present inventor investigated the thermal stress exerted on the lower metal line 22. The present inventor varied the temperature around the lower metal line 22, and determined the thermal stress exerted on the lower metal line 22. The thermal stress is plotted in FIG. 4. While the temperature was rising, the thermal stress was changed from the tensile stress to the compressive stress as indicated by arrow A1, and the compressive stress was maximized around 200 degrees Centigrade. After reaching the maximum compressive stress, the compressive stress was decreased together with the temperature as indicated by arrow A2. On the other hand, while the temperature was lowered, the compressive stress was changed to the tensile stress, and the tensile stress was increased inversely to the temperature as indicated by arrow A3.

When the lower metal line 22 was pattered, the tensile stress was exerted on the lower metal line 22. While the insulating material was being deposited for the second inter-level insulating layer 23, the lower metal line 22 was heated toward 380 degrees Centigrade, and the tensile stress was changed to the compressive stress (see arrow A1). However, the aluminum grains were grown in high temperature ambient, and the compressive stress was decreased after 20 degrees Centigrade (see arrow A2). Upon completion of the deposition, the lower metal line was cooled as indicated by allow A3, and the tensile strength was left on the lower metal line 22. However, the lower metal line 22 withstood the variation of thermal stress along the loop indicated by arrows A1, A2, and A3, and any hillock and any whisker were not observed.

The outgassing was carried out at the substrate temperature not higher than the substrate temperature TW in the plasma-assisted chemical vapor deposition. This meant that the variation of thermal stress was equivalent to or milder than the variation of thermal stress in the deposition for the second inter-level insulating layer 23. For this reason, the lower metal line 22 withstood the thermal stress during the outgassing, and any hillock and any whisker did not grow. Thus, the lower-metal lines 22 were free from short-circuits.

Figure 5:
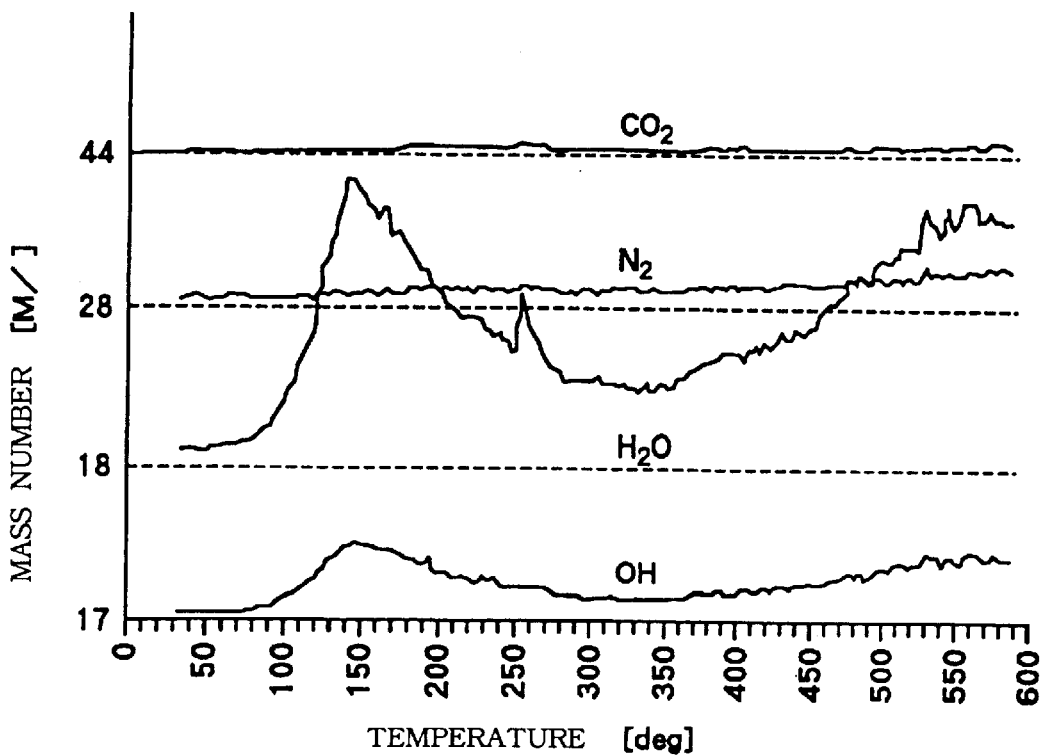
FIG. 5 is a graph showing the mass number of residual contaminants in terms of an outgassing temperature.

Subsequently, the present inventor evaluated the substrate temperature during the outgassing. The present inventor carried out the outgassing at different temperatures, and measured variation of the contaminant such as $CO_2$, $N_2$, $H_2O$ and OH. The contaminants $CO_2$, $N_2$, $H_2O$ and OH were plotted in terms of the outgassing temperature in FIG. 5. The contaminant OH was decomposed from water $H_2O$ at the measurement, and both the mass numbers 17 and 18 were representative of water. The residual contaminants were sufficiently reduced around 380 degrees Centigrade, and the outgassing temperature equal to the deposition temperature TW was acceptable for the process.

Finally, the present inventor investigated the high-temperature low-rate sputtering. As described hereinbefore, the high-temperature low-rate sputtering was carried out at the substrate temperature ranging between 400 degrees to 500 degrees Centigrade. The present inventor deposited the aluminum at 490 degrees Centigrade at a low deposition rate after the outgassing at 390 degrees Centigrade, and checked the samples to see whether or not a hillock or a whisker occurred in the lower metal lines 22. The present inventor confirmed that the lower metal lines 22 were never damaged. Thus, even though the aluminum layer 28 was formed by using the high-temperature low-rate sputtering, the high substrate temperature did not result in any hillock or whisker formation. The phenomenon was derived from the constraint on the lower metal line 22. The outgassing had been carried out before the titanium layer 25 was deposited, and the lower metal line 22 was without any constraint. On the other hand, the aluminum/aluminum alloy was deposited through the high-temperature low-rate sputtering after the formation of the titanium/aluminum layers 25/26. The titanium/aluminum layers 25/26 served as the constraint, and prevented the lower metal line 2 from forming a hillock or whisker. Thus, only the outgassing had the influence on the lower metal line 22.

As will be understood from the foregoing description, the outgassing is carried out at the substrate temperature not higher than the substrate temperature for deposition of the second inter-level insulating layer 23, and the lower metal line 22 may thus withstand the thermal stress during the outgassing This results in that a hillock and a whisker are not produced in the lower metal line 22, and a short-circuit does not take place between the lower metal lines. Thus, the process according to the present invention improves the step coverage without sacrificing the reliability of lower metal lines 22.

Second Embodiment

FIGS. 6A to 6H illustrate another process for fabricating a semiconductor device embodying the present invention. The process also starts with preparation of a semiconductor substrate (not shown). Field effect transistors (not shown) are, by way of example, fabricated on the major surface portion of the semiconductor substrate. The field effect transistors are covered with a first inter-level insulating layer 31.

Figure 6A:
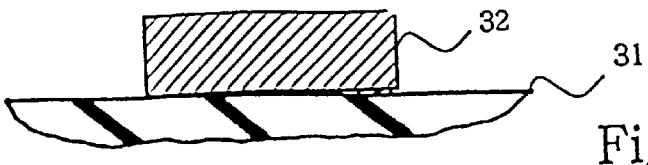
FIGS. 6A to 6H are cross sectional views showing another process for fabricating a semiconductor device according to the present invention.

Conductive material of aluminum or aluminum alloy is deposited over the entire surface of the first inter-level insulating layer 31, and forms an aluminum/aluminum alloy layer. The aluminum alloy may be aluminum-copper alloy or aluminum-silicon-copper alloy. A photo-resist etching mask (not shown) is patterned on the aluminum/aluminum alloy layer through a photo-lithography process, and the aluminum/aluminum alloy layer is selectively etched by using the photo-resist etching mask. The aluminum/aluminum alloy layer is patterned into lower metal lines 32, one of which is shown in FIG. 6A.

Figure 6B:
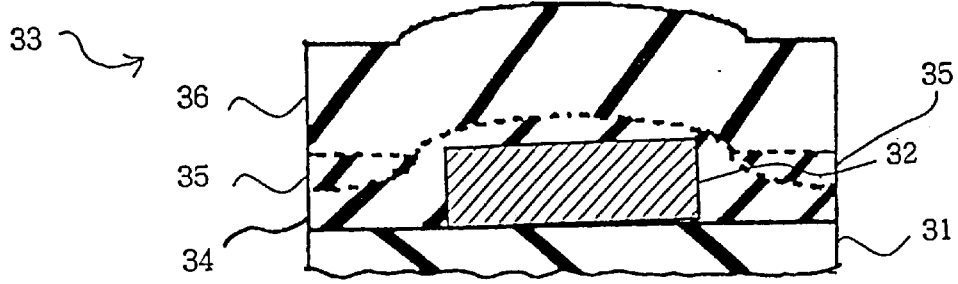

Subsequently, the lower metal lines 32 are covered with a second inter-level insulating layer 33 as follows. Silicon oxide is deposited over the entire surface using a plasma-assisted chemical vapor deposition at 450 degrees Centigrade. The silicon oxide forms a silicon oxide layer 34, which conformably extends over the lower metal lines 32. The silicon oxide layer 34 prevents a silica layer 35 from cracking, and, accordingly, serves as a linear layer. Silica solution is spread over the silicon oxide layer 34, and forms the silica layer 35. The silica layer 35 also conformably extends over the silicon oxide layer 34, and is subjected to a dry etching without any etching mask. As a result, the silica layer 35 is etched back, and is left on the silicon oxide layer 34 between the lower metal lines 32. The etch-back step may alternatively be deleted from the process. Silicon oxide is deposited over the entire surface of the resultant structure using the plasma-assisted chemical vapor deposition, again, and forms a silicon oxide layer 36. The silicon oxide layer 36 serves as a cap layer. The resultant structure is annealed at 450 degrees Centigrade, and the silica layer 35 is baked. The silicon oxide layers 34/36 and the silica layer 35 as a whole constitute the second inter-level insulating layer 33. The resultant structure is shown in FIG. 6B.

Figure 6C:
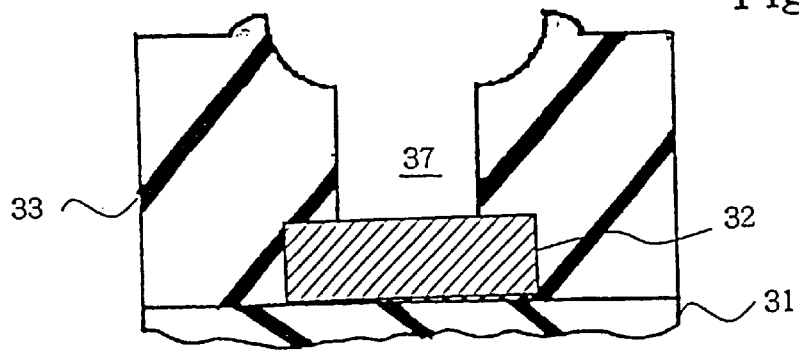
Figure 6D:
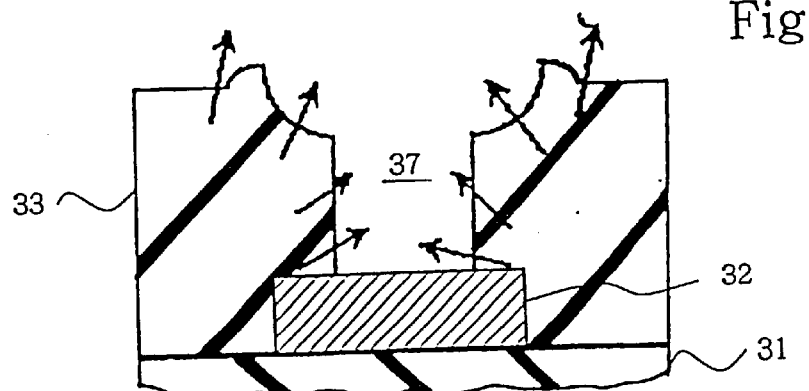

A photo-resist etching mask (not shown) is patterned on the second inter-level insulating layer 33 by using photo-lithography, and a via-hole 37 is formed in the second inter-level insulating layer 33 through dry etching followed by wet etching as shown in FIG. 6C. The via-hole 37 may be formed through dry etching only.

Subsequently, an upper metal line 38 is formed by using a multiple-step sputtering technique. The upper metal line 38 is formed of aluminum or aluminum alloy. In this instance, the aluminum alloy is, by way of example, aluminum-copper alloy or aluminum-silicon-copper alloy. The resultant structure is placed in an air-tight chamber, and vacuum is developed in the air-tight chamber. First, an outgassing is carried out at 450 degrees Centigrade, which is equal to the deposition temperature of the silicon oxide layers 34/36 and the annealing temperature. The silica layer 35 contains much water. The outgassing temperature is high enough to remove the water and the contaminants as indicated by arrows in FIG. 6D.

Figure 6E:
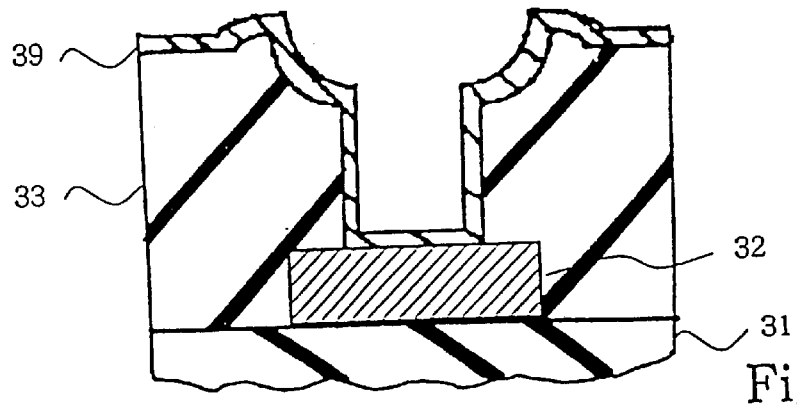
Figure 6F:
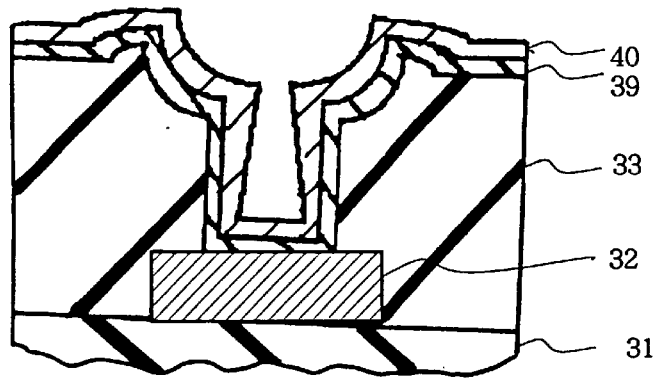
Figure 6G:
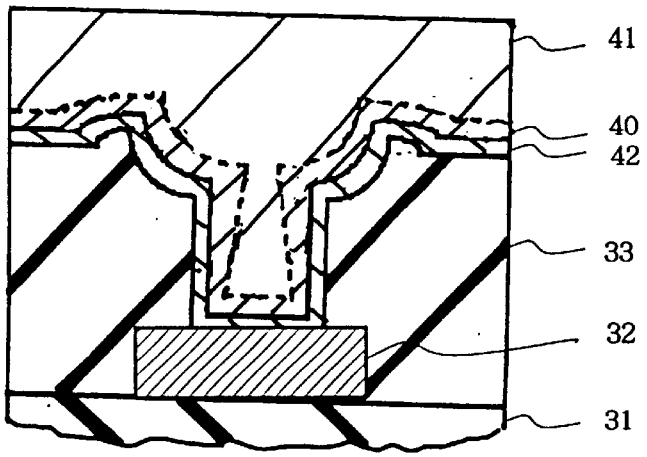

Upon completion of the outgassing, the resultant structure is cooled down. However, the vacuum is never broken. Titanium is conformably deposited over the entire surface of the resultant structure without any preheating by using a sputtering process, and forms a titanium layer 39 as shown in FIG. 6E. The titanium layer 39 enhances the wettability of the aluminum/aluminum alloy. Thereafter, the aluminum or the aluminum alloy is deposited over the titanium layer 39 at a low temperature and a high deposition rate, However, the vacuum is maintained in the air-tight chamber. The aluminum/aluminum forms an aluminum/aluminum alloy layer 40, which conformably extends on the titanium layer 39 as shown in FIG. 6F. Finally, the aluminum or the aluminum alloy is deposited over the aluminum/aluminum alloy layer 40 at a high temperature and a low deposition rate without breaking the vacuum. The high-temperature ambience enhances the surface diffusion of aluminum/aluminum alloy. The aluminum/aluminum alloy fills the hollow space defined by the aluminum/aluminum alloy layer 40 in the via-hole 37, sand swells into an aluminum/aluminum alloy layer 41 as shown in FIG. 6G. While the aluminum/aluminum alloy is being deposited, titanium reacts with the aluminum and the titanium layer 39 is converted to a titanium-aluminum layer 42.

Figure 6H:
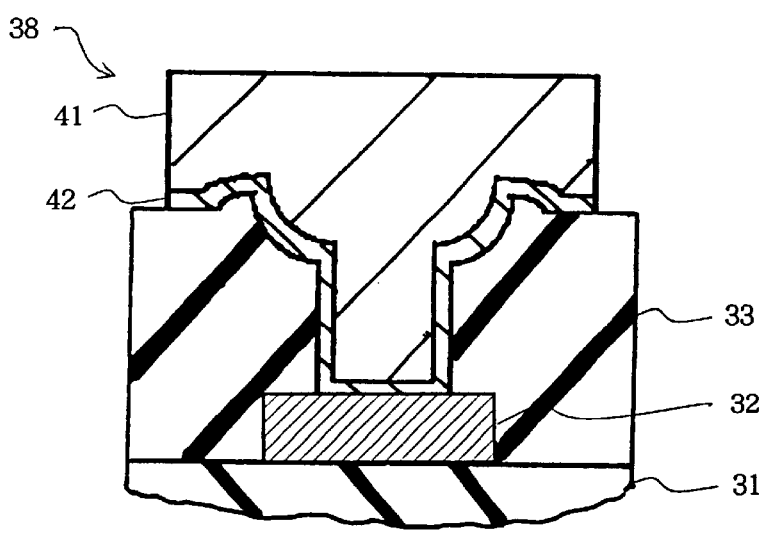

Finally, a photo-resist etching mask (not shown) is patterned on the aluminum/aluminum alloy layer 41, and the aluminum/aluminum alloy layer 41 and the titanium-aluminum alloy layer 42 are selectively etched away by using a dry etching process. Then, the upper metal line 38 is left on the second inter-level insulating layer 33 as shown in FIG. 6H.

In the process implementing the second embodiment, the outgassing is carried out at the temperature equal to the maximum temperature in the formation of second inter-level insulating layer, and any hillock, whisker, and any void do not form on the lower metal line 32. Although the silica layer 35 is moisture absorbent, the water and water component arc eliminated from the silica layer through the outgassing, and the manufacturer can use the silica layer 35 as the smoothening technique. metal line 32. Although the silica layer 35 is moisture absorbent, the water and water component arc eliminated from the silica layer through the outgassing, and the manufacturer can use the silica layer 35 as the smoothening technique.

As will be appreciated from the foregoing description, the outgassing is carried out at the certain temperature equal to or less than the maximum temperature in the inter-level insulating layer over the lower metal lines, and thus the outgassing according to the present invention does not damage the lower metal lines during the deposition of the aluminum/aluminum alloy at the high temperature. Thus, even though the miniature via-holes are formed in the inter-level insulating layer, the process according to the present invention enhances the reliability of the lower metal lines without a void in the via-holes.

Although particular embodiments of the present invention have been shown and described, it will be apparent to those skilled in the art that various changes and modifications may be made without departing from the spirit and scope of the present invention.

For example, although the multiple step sputtering technique is popular, the multiple step sputtering may be replaced with an aluminum reflow technique, a high-temperature high-pressure sputtering or a high-temperature sputtering for the deposition of the aluminum/aluminum alloy.

In the second embodiment, the second inter-level insulating layer 33 may be smoothened by using a chemical mechanical polishing instead of the silica layer 35.

What is claimed is:

1. A process for fabricating a semiconductor device, comprising the steps of:
   a) forming at least one lower metal line over a semiconductor substrate;
   b) covering said lower metal line with an inter-level insulating layer wherein said semiconductor substrate is heated to a temperature that is less than or equal to a first temperature, wherein said inter-level insulating layer is deposited at the first temperature;
   c) forming at least one via-hole in said inter-level insulating layer;
   d) performing out an outgassing process wherein said semiconductor substrate is heated to a second temperature that is equal to or less than said first temperature; and
   e) forming at least one upper metal line penetrating into said via-hole and formed of a conductive material selected from the group consisting of aluminum and aluminum alloys wherein said at least one upper metal line is formed in a vacuum deposition at a temperature that is lower than said first temperature.

2. The process as set forth in claim 1, in which said second temperature is equal to or higher than 200 degrees Centigrade, and is lower than said first temperature by about zero to 400 degrees Centigrade.

3. The process as set forth in claim 2, in which said first temperature is within the range between 200 degrees and 600 degrees Centigrade.

4. The process as set forth in claim 1, in which said step b) further includes the substep of depositing an insulating material by using a plasma-assisted chemical vapor deposition at said first temperature so as to form an insulating material layer for said inter-level insulating layer.

5. The process as set forth in claim 4, in which said step b) further includes the sub-step of chemically mechanically polishing an upper surface of said insulating material layer so as to create a planar smooth top surface of said inter-level insulating layer.

6. The process as set forth in claim 1, in which said step b) further includes the sub-steps of

- b-1) depositing said inter-level insulating material by using a plasma-assisted chemical vapor deposition for forming a liner insulating layer,
- b-2) spreading a solution containing at least silica over said liner insulating layer for conformably forming a silica layer on said liner insulating layer,
- b-3) carrying out an etch-back so as to selectively leave said silica layer on said liner insulating layer at least between said at least one lower metal line over a semiconductor substrate and another lower metal line,
- b-4) depositing an insulating material by using a plasma-assisted chemical vapor deposition for covering said silica layer and covering exposed surfaces of said liner insulating layer with a cap layer, and
- b-5) annealing the resultant structure of said sub-step b-4) so as to bake said silica layer.

7. The process as set forth in claim 6, in which said step of annealing the structure of said sub-step b-4 is carried out at said first temperature.

8. The process as set forth in claim 6, in which said inter-level insulating material is deposited at said first temperature.

9. The process as set forth in claim 1, in which said steps d) and e) are carried out in vacuum without breaking said vacuum between the occurrence of said steps d) and e).

10. The process as set forth in claim 9, in which said step e) further includes the sub-steps of

- e-1) depositing said conductive material at a temperature equal to said first temperature in a vacuum over the entire surface of the resultant structure of said step d) so as to fill said via-hole and, thereafter, swell into a conductive material layer, and
- e-2) patterning said conductive material layer into said upper metal line.

11. The process as set forth in claim 10, in which said sub-step e-1) includes the sub-steps of

- e-1-1) depositing said conductive material over the entire surface of said resultant structure of said step d) at a third temperature lower than said first temperature and at a relatively high deposition rate, and
- e-1-2) changing the deposition temperature from said third temperature to a fourth temperature higher than said third temperature but lower than said first temperature for enhancing a surface diffusion of said conductive material and changing the deposition rate from said relatively high deposition rate to a relatively low deposition rate.

12. The process as set forth in claim 11, in which a sputtering process is used in said sub-steps of e-1-1) and e-1-2).

13. The process as set forth in claim 11, in which said step e-1) further includes the sub-step of improving a wettability property for said conductive material before performing said sub-step e-1-1).

14. The process as set forth in claim 13, in which said wettability property is improved by depositing a layer comprising at least titanium over the entire surface of said resultant structure of said step d).

* * * * *